United States Patent [19]

Fukuzawa et al.

[11] Patent Number: 4,752,934
[45] Date of Patent: Jun. 21, 1988

[54] MULTI QUANTUM WELL LASER WITH PARALLEL INJECTION

[75] Inventors: Tadashi Fukuzawa, Tokyo; Naoki Chinone, Hachioji; Kazuhisa Uomi, Kokununji; Takashi Kajimura, Tokyo, all of Japan

[73] Assignee: Hitachi, Ltd., Tokyo, Japan

[21] Appl. No.: 898,199

[22] Filed: Aug. 20, 1986

[30] Foreign Application Priority Data

Sep. 20, 1985 [JP] Japan .................................. 60-206444

[51] Int. Cl.$^4$ ................................................ H01S 3/19
[52] U.S. Cl. ........................................ 372/46; 372/44; 372/45
[58] Field of Search ........................ 372/44, 45, 46, 43

[56] References Cited

U.S. PATENT DOCUMENTS

| 4,594,603 | 6/1986 | Holonyak, Jr. ......................... 35/16 |
| 4,644,553 | 2/1987 | Van Ruyven et al. ............... 372/45 |

FOREIGN PATENT DOCUMENTS

| 0225680 | 12/1983 | Japan .................................... 372/45 |
| 0023584 | 2/1984 | Japan .................................... 372/45 |

OTHER PUBLICATIONS

J. E. Bowers et al., "High-Frequency Constricted Mesa Lasers"; Appl. Phys. Lett., vol. 47, No. 2, Jul. 1985, pp. 78–80.

Primary Examiner—James W. Davie
Assistant Examiner—B. Randolph
Attorney, Agent, or Firm—Antonelli, Terry & Wands

[57] ABSTRACT

A semiconductor laser having such a structure that a laser structure including a laser active region of multi quantum well structure, cladding layers and a cap layer is formed on a substrate, is disclosed in which both end regions of the laser active region in the quantum well layer is converted into mixed crystal by impurity induced intermixing so that a multi quantum well active region is sandwiched between mixed crystal regions, and impurity diffused regions are formed between the surface of the crystal and the mixed crystal regions, to form a current path and to inject carriers into the multi quantum well region in a direction parallel to the laser active layer. Thus, the semiconductor laser can modulate laser oscillation at a very high frequency, and moreover is readily fabricated or integrated.

28 Claims, 2 Drawing Sheets

F I G. 1
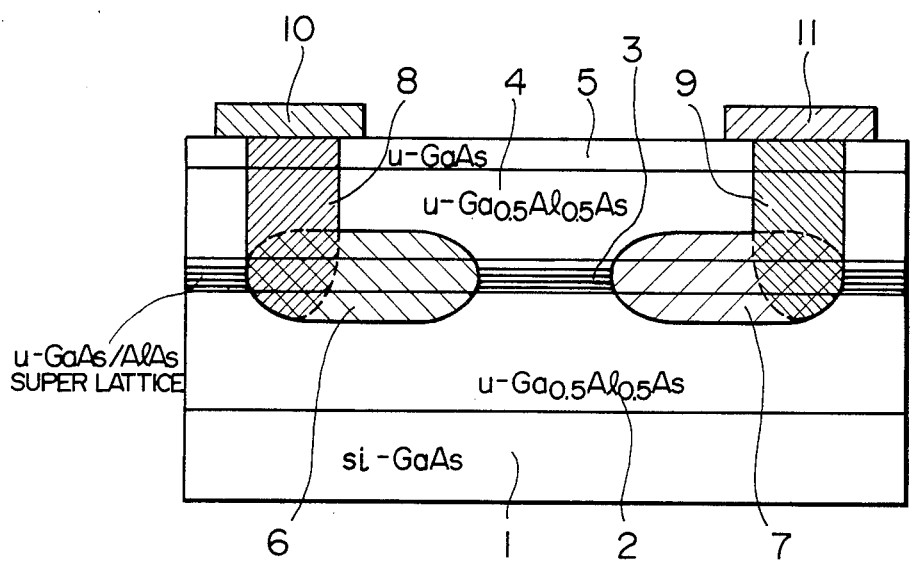

MULTI QUANTUM WELL LASER WITH PARALLEL INJECTION

BACKGROUND OF THE INVENTION

The present invention relates to a semiconductor laser capable of modulating laser oscillation at a frequency of 10 GHz or more.

One of the factors which determine the upper limit of the modulation frequency of a semiconductor laser, is the capacitance of the pn junction included in the laser. In order to reduce the junction capacitance, a laser structure has been devised in which semiconductor regions other than an active region indispensable for laser oscillation is etched off, and the remaining laser active layer is buried in a material having a dielectric constant smaller than that of the laser active layer (J. E. Bowers et al., Appl. Phys. Lett., Vol. 47, 1985, page 78). According to Bowers et al., however, a semiconductor crystal is buried in an $SiO_2$ layer, and hence many crystal defects are generated in or on the semiconductor crystal. Thus, the above laser structure has a relatively short life, and is unfavorable from the practical point of view.

SUMMARY OF THE INVENTION

It is an object of the present invention to provide a semiconductor laser which has small electric capacitance, to make it possible to modulate laser oscillation at an ultra high frequency, and which is long-lived.

In order to make small the whole capacitance of a semiconductor laser element, it is necessary to reduce the capacitance of a pn junction indispensable for laser oscillation and to reduce the parasitic capacitance of the laser structure. In view of the above fact, a semiconductor laser according to the present invention has a current confinement structure which can result in confinement of the light-emitting region and hence an optical mode confinement structure for enhancing a single mode oscillation by the confinement of light-emitting region, without increasing the electric capacitance of a laser element. In other words, a semiconductor laser according to the present invention uses a multi quantum well layer which is larger in the height and the width of the quantum barrier compared to the conventional case wherein carriers are injected perpendicularly across the barrier layer and shows a remarkable quantum size effect, as a laser active layer, to increase the carrier density in a laser active region and to generate laser oscillation efficiently. If carriers should be injected by tunneling through the barrier layer or layers, the height and the width of the potential barrier cannot be made too large. Then, the quantum size effect due to confinement in a narrow well cannot be made large. The inventive parallel arrangement solves these problems. Further, in the above semiconductor laser, the capacitance of a laser element can be reduced to a least value by disposing the n+ and p+ regions at the ends of a super lattice, and thus the modulation frequency of the laser can be increased in a large degree.

BRIEF DESCRIPTION OF THE DRAWINGS

FIG. 1 is a sectional view showing an embodiment of a semiconductor laser according to the present invention.

DESCRIPTION OF THE PREFERRED EMBODIMENTS

Figure 2A:
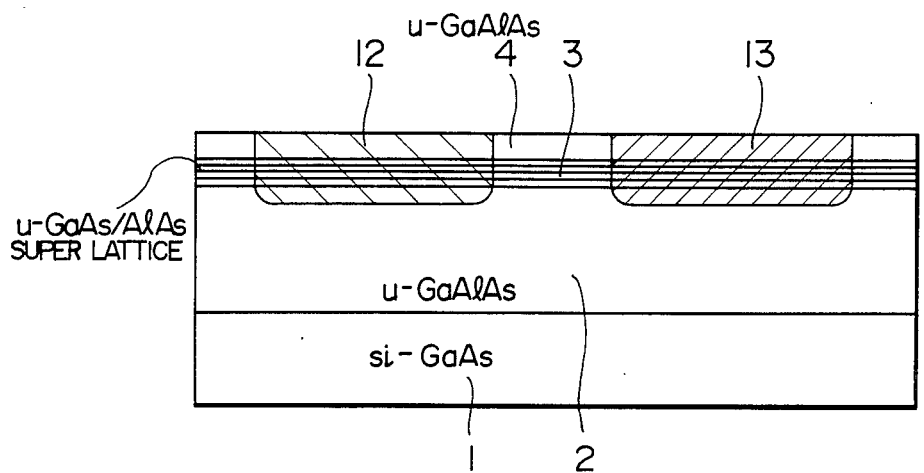
FIGS. 2a and 2b are sectional views for explaining another embodiment of a semiconductor laser according to the present invention.

The present invention will be explained below in detail, on the basis of the following embodiments.

EMBODIMENT I

Referring to FIG. 1 which shows an embodiment of a semiconductor laser according to the present invention, an undoped $Ga_{0.5}Al_{0.5}As$ layer 2 (having a thickness of 2 $\mu$m and serving as a cladding layer), an undoped super lattice layer 3 (serving as a laser active layer), an undoped $Ga_{0.5}Al_{0.5}As$ layer 4 (having a thickness of 2 $\mu$m and serving as another cladding layer), and an undoped GaAs layer 5 (having a thickness of 0.2 $\mu$m and serving as a cap layer) are grown by the molecular beam epitaxial growth method, to form a laser structure on a semi-insulative GaAs substrate 1. Here, the cladding layers 2 and 4 clad the active layer 3 for generating laser oscillation, and the cap layer 5 encapsulates these structures. It is to be noted that the term "undoped layer" which is herein used, includes an unintentionally doped layer. The super lattice layer 3 is formed of GaAs layers each having a thickness of 50 Å and AlAs layers each having a thickness of 50Å, stacked alternately. Silicon ions are accelerated by an implantation voltage of 2.3 MV and then implanted from the first open area of a mask into the laser crystal at a dose rate of $2\times10^{13}$ $cm^{-2}$ so that an n type region 6 has a silicon concentration of more than $1\times10^{18}$ $cm^{-3}$.

Next, aluminum ions are accelerated by an implantation voltage of 2.3 MV, and then implanted from the second open area of the mask into the laser crystal at a dose rate of $4\times10^{13}$ $cm^{-2}$ so that an ion implanted region 7 is formed. Further, beryllium ions are accelerated by an implantation voltage of 250 KV, and then implanted from the second open area of the mask into the laser crystal, to implant the p type region 7 with beryllium. Here, it may be noted that the ions implanted with high energies will produce a buried doped region below the surface and that implanted impurity in the superlattice not only serves to afford conductivity but may also serve to induce alloying of the superlattice. Aluminum is used mainly for inducing alloying.

Next, silicon ions and beryllium ions are implanted into the laser crystal so as to form a silicon implanted region 8 and a beryllium implanted region 9, which serve as n-type and p-type contact regions for electrodes, respectively. When each of the regions 8 and 9 is formed, ion implantation is carried out several times in such a manner that the implantation voltage is successively decreased, in order for the regions 8 and 9 to become an n+-type region having a uniform silicon concentration and a p+-type region having a uniform beryllium concentration. Thereafter, the laser crystal is annealed at 850° C. for five hours in the atmosphere of arsenic, to convert those implanted regions of the super lattice layer 3 which are included in the implanted regions 6 and 7, into a mixed crystal by the impurity induced intermixing of gallium and aluminum atoms. Thus, thin potential well layers connect the p+ and n+ mixed crystal regions. The distance between the first and second open areas of the mask is so selected as to put the width of that region of the super lattice layer 3 which is sandwiched between the mixed crystal regions 6 and 7, in a range from 0.8 to 1.5 μm. When a super lattice (multi-quantum-well) includes impurity atoms and is applied with thermal energy of a certain order, intermixing of constituent atoms occur among all the barrier and well layers to form a mixed crystal, i.e. vanish MQW. The required impurity atoms may be implanted or diffused. The resultant region will have a low resistivity.

A negative electrode 10 and a positive electrode 11 is provided on the same surface of the laser crystal in the form of a stripe having a width of 10 μm. Each electrode has a outwardly protruding pad for bonding, at a central portion thereof. Thus, the electric capacitance of the laser structure is reduced, compared to the parallel facing electrodes. The length of a laser cavity is made equal to 150 μm.

According to the inventors' experiments, the above semiconductor laser had an electric capacitance of less than 1 pF, and the threshold current of laser oscillation was 5 mA. Further, in the room temperature operation generating an output of 5 mW, an output drop of 3 dB was observed at a modulation frequency of 17 GHz. In the case of the 10-mW output, an output drop of 3 dB was observed at a modulation frequency of 23 GHz.

Now, explanation will be made of the reason why the present embodiment can modulate laser oscillation at such a high frequency. In the present embodiment, it is not required to inject carriers into the super lattice layer in directions perpendicular thereto, i.e. across the barrier layer. Accordingly, the barrier outside a quantum well can be made sufficiently large in height by selecting an appropriate material for the barrier layer, and thus the overflow loss of carriers can be reduced. Further, because no tunneling is required for carrier transport, the width of the barrier layer on both sides of a well layer can be made sufficiently wide, and thus the energy state broadening at individual quantum wells by sub-band formation can be prevented. Accordingly, a variation in the amount of injected carriers causes a large change in gain, and hence the present embodiment is high in relaxation oscillation frequency $f_r$. Thus, the present embodiment can modulate laser oscillation at a high frequency.

Next, let us consider the capacitance of the present embodiment. In the present embodiment, a pn junction is formed in such a manner that the super lattice region having a width of about 1 μm is sandwiched between the n-type ion-implanted region 6 and the p-type ion-implanted region 7, each of which has a thickness of thousands of angstroms. Accordingly, the pn junction is far smaller in junction capacitance than the pn junction of an ordinary semiconductor laser. Further, when laser oscillation is generated, the electric resistance between the p-type region 7 and the n-type region 6 is reduced, and thus the capacitance between the ion-implanted regions 6 and 8 and the ion-implanted regions 7 and 9, are as if they are shunted by a low-resistance current path, because the super lattice layer 3 therebetween has a low resistivity. That is, the above capacitance has only a little effect on a modulating operation. In the present embodiment, impurity doping is carried out only by ion implantation.

For the above reasons, the present embodiment can modulate laser oscillation at a very high frequency.

Although ion implantation has been employed for doping impurity in the above embodiment, impurity diffusion can be employed as well, e.g. for the formation of the regions 8 and 9. When diffusion is employed, annealing is not always necessary.

EMBODIMENT II

Figure 2B:
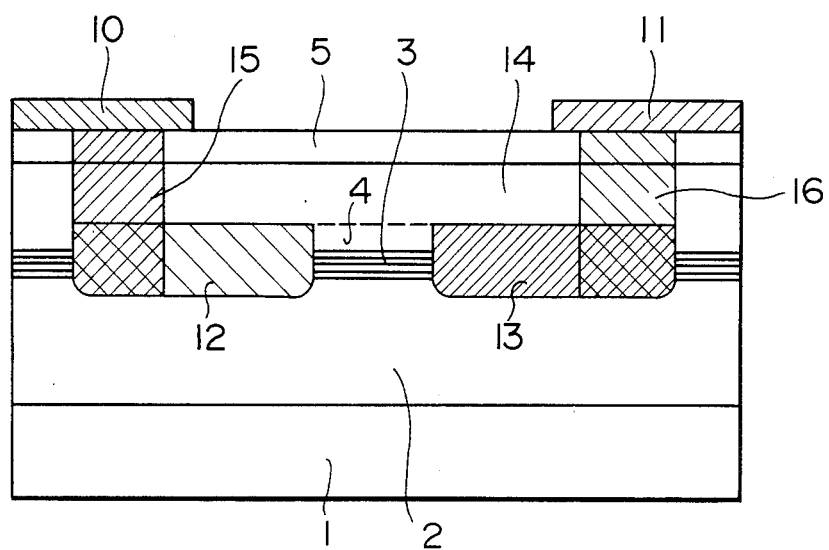

Another embodiment of a semiconductor laser according to the present invention is formed by using an ion implantor, a molecular beam epitaxial growth apparatus, and an ultra-high vacuum transport chamber disposed between the ion implantor and the molecular beam epitaxial growth apparatus. Referring to FIG. 2a, an undoped $Ga_{0.5}Al_{0.5}As$ layer 2 (serving as a cladding layer), an undoped super lattice layer 3 (serving as a laser active layer) and an undoped $Ga_{0.5}Al_{0.5}As$ layer 4 (serving as another cladding layer) are grown in the molecular beam epitaxial growth apparatus to form a semiconductor crystal on a semi-insulative GaAs substrate 1. The super lattice layer 3 is formed of $Ga_{0.9}Al_{0.1}As$ layers each having a thickness of 60Å and AlAs layers each having a thickness of 80 Å. The semiconductor crystal and the substrate are transferred to the ion implantor through the transport chamber, and then silicon ions are implanted into a region 12 through the maskless ion implantation technique using a silicon ion beam. Next, zinc ions are implanted into a region 13 by a zinc ion beam. The thickness of the cladding layer 4 is made small (for example, equal to 500 Å) so that zinc ions can reach the super lattice layer 3. Then, the semiconductor crystal and the substrate are returned to the molecular beam epitaxial growth apparatus through the transport chamber. Referring now to FIG. 2b, an undoped $Ga_{0.5}Al_{0.5}As$ layer 14 (serving as an extended portion of the cladding layer 4) and an undoped GaAs layer 5 (serving as a cap layer) are successively grown. A laser structure thus obtained is transferred to the ion implantor through the transport chamber, and then silicon ions and beryllium ions are implanted into regions 15 and 16, respectively. Thereafter, the crystal is annealed at 750° C., to activate implanted ions and to convert those regions of the super lattice layer 3 which are included in the ion implanted regions 12 and 13, into a mixed crystal, thereby obtaining the buried heterostructure of super lattice. Then, electrodes 10 and 11 are formed so as to be put in ohmic contact with the ion implanted regions 15 and 16, respectively. The present embodiment having a cavity length of 150 μm was attached to a high-frequency mount, to study the modulation characteristics of the embodiment. According to the inventors' experiments, in the room temperature operation generating an output of 5 mW, an output drop of 3 dB was observed at a modulation frequency of 20 GHz. In the case of the 10-mW output, an output drop of 3 dB was observed at a modulation frequency of 25 GHz.

EMBODIMENT III

A further embodiment of a semiconductor laser according to the present invention is fabricated in the following manner. An undoped InP layer (having a thickness of 2 μm and serving as a cladding layer), an undoped $Al_{0.52}In_{0.48}As$ layer (having a thickness of 0.5 μm and serving as a barrier layer), an undoped multi quantum well layer (having a thickness of 0.5 μm and serving as a laser active layer), an undoped $Al_{0.52}In_{0.48}As$ layer (having a thickness of 0.5 μm and serving as another barrier layer), an undoped InP layer (having a thickness of 1.5 μm and serving as another cladding layer), and an undoped $Ga_{0.47}In_{0.53}As$ layer (having a thickness of 0.1 μm and serving as a cap layer) are grown in this order by the molecular beam epitaxial growth method using gas sources, to form a laser structure on a semi-insulative InP substrate. The multi quantum well layer is formed in such a manner that a $Ga_{0.47}In_{0.53}As$ layer (having a thickness of 100 Å and serving as a quantum well layer) and an $Al_{0.52}In_{0.48}As$ layer (having a thickness of 100 Å and serving as a barrier layer) are alternately and repeatedly grown. The structure thus obtained is subjected to the same processing as described in the EMBODIMENT I. That is, the laser structure is implanted (namely, the super lattice layer) is converted into a mixed crystal layer and ion implanted regions make up such a current path as shown in FIG. 1. Thereafter, positive and negative electrodes are formed on the laser crystal, to complete the present embodiment. According to the inventors' experiments, the above embodiment generated laser oscillation having a single transverse mode, had an oscillation wavelength of 1.52 μm, and was able to modulate laser oscillation at a very high frequency. That is, the modulation frequency corresponding to an output drop of 3 dB was 16 GHz.

In the present embodiment, it is desirable that the thickness of each of quantum well layers included in the multi quantum well layer lies in a range from 30 to 200 Å and the thickness of each of barrier layers included in the multi quantum well layer lies in a range from 20 to 400 Å. When the thickness of each quantum well layer and that of each barrier layer are made too small to lie below the respective ranges, a mutual interaction will abruptly increase between quantum wells, and thus the function of quantum well is lost. When the thickness of each quantum well layer and that of each barrier layer are made so large as to exceed the respective upper limits, the quantum size effect of the quantum well layer is abruptly decreased, and thus it becomes impossible to modulate laser oscillation at a very high frequency and to control the mode of laser oscillation.

Further, it is preferred to put the total thickness of the multi quantum well layer in a range from 0.01 to 0.15 μm.

We claim:
1. A semiconductor laser comprising:
a semi-insulative substrate; and
a laser structure formed on said substrate so as to define a resonant cavity and including (1) an undoped laser active layer having quantum well and barrier layers and (2) at least two undoped semiconductor clad layers, said laser active layer being sandwiched between said semiconductor clad layers, each of said semiconductor clad layers having an energy band gap larger than the energy band gap of the quantum well layers, regions of said laser active layer on both sides of that region thereof which serves as a laser active region and which is extended in the lengthwise direction of the resonant cavity, being converted into a mixed crystal by impurity induced intermixing based upon selected impurity doping, one of the mixed crystal regions being doped with an impurity so as to form a p-type region, the other mixed crystal region being doped with another impurity so as to form an n-type region, said laser structure including means for injecting carriers into said laser active region which is sandwiched between said mixed crystal regions, in a direction parallel to said laser active layer.

2. A semiconductor laser according to claim 1, wherein said carrier injection means includes means for supplying a current to said mixed crystal regions.

3. A semiconductor laser according to claim 1, wherein said substrate is made of InP, and said laser active layer having a multi quantum well structure comprises alternate GaInAs and AlInAs layers.

4. A semiconductor laser according to claim 1, wherein said substrate is made of GaAs, and said laser active layer having a multi quantum well structure comprises alternate GaAlAs and AlAs layers.

5. A semiconductor laser according to claim 2, wherein said current supplying means includes impurity doped regions, each of which is formed by one of impurity diffusion and impurity ion implantation.

6. A semiconductor laser according to claim 1, wherein said means for injecting carriers includes impurity doped regions respectively extending from a surface of said laser structure to said mixed crystal regions.

7. A semiconductor laser according to claim 6, wherein said impurity doped regions are respectively electrically connected to electrodes on said surface of saod laser structure.

8. A semiconductor laser according to claim 6, wherein said mixed crystal regions are buried in said laser structure.

9. A semiconductor laser according to claim 8, further including a cap layer on said surface of said laser structure.

10. A semiconductor laser according to claim 9, wherein said impurity doped regions extend through said cap layer to the surface thereof, with electrodes being provied respectively in contact with said impurity doped regions, on said surface of the cap layer.

11. A semiconductor laser according to claim 1, wherein said mixed crystal regions are buried in said laser structure.

12. A semiconductor laser according to claim 11, wherein said elective impurity doping is provided by ion implantation, in forming the mixed crystal buried in the laser structure.

13. A semiconductor laser according to claim 1, wherein said substrate is a GaAs substrate, the semiconductor clad layers are of GaAlAs, and the quantum well and barrier layers are GaAs and AlAs layers.

14. A semiconductor laser according to claim 13, wherein said mixed crystal regions are buried in said laser structure.

15. A semiconductor laser according to claim 14, wherein the mixed crystal region doped with an impurity so as to form the p-type region has been doped with aluminum ions and beryllium ions, and the mixed crystal region doped with an impurity so as to form the n-type region has been doped with silicon ions.

16. A semiconductor laser according to claim 15, further comprising contact regions respectively extending from the buried mixed crystal regions to a surface of the laser structrue, the contact regions being $n^+$-type and $p^-$-type implanted regions respectively in contact with the n-type and p-type mixed crystal regions, the $n^+$-type and $p^+$-type contact regions being formed respectively by introducing silicon and beryllium into the laser structure.

17. A semiconductor laser according to claim 16, wherein the laser active region, sandwiched between said mixed crystal regions, has a width of 0.8 to 1.5 μm between said mixed crystal regions.

18. A semiconductor laser according to claim 1, wherein said at least two undoped semiconductor clad layers, sandwiching said laser active layer, includes at least two upper undoped semiconductor clad layers on the laser active layer, and wherein the mixed crystal regions extend to an upper surface of a lower one of the at least two upper undoped semiconductor clad layers but are buried in said laser structure.

19. A semiconductor laser according to claim 18, wherein said at least two undoped semiconductor clad layers are of GaAlAs, said substrate is of a semi-insulative GaAs, and the quantum well and barrier layers are of GaAlAs and AlAs.

20. A semiconductor laser according to claim 19, wherein the mixed crystal region doped with an impurity so as to form the p-type region has been doped with zinc ions, and the mixed crystal region doped with an impurity so as to form the n-type region has been doped with silicon ions.

21. A semiconductor laser according to claim 20, further comprising contact regions respectively extending from a surface of the laser structure to the mixed crystal regions, the contact regions being n-type and p-type implanted regions respectively in contact with the n-type and p-type mixed crystal regions, the n-type and p-type contact regions being formed by implanting silicon ions and beryllium ions, respectively, into the laser structure.

22. A semiconductor laser according to claim 18, wherein the buried mixed crystal regions are regions formed by providing said lower one of the at least two upper undoped semiconductor clad layers on said laser active layer; performing the selected impurity doping by implanting the impurity for producing the mixed crystal regions in said lower one of the at least two upper undoped semiconductor clad layers; and forming another of the at least two upper undoped semiconductor clad layers so as to provide the buried mixed crystal regions.

23. A semiconductor laser according to claim 1, wherein each of the quantum well layers has a thickness of 30–200 Å, and each of the barrier layers has a thickness of 20–400 Å.

24. A semiconductor laser according to claim 23, wherein the total thickness of the quantum well and barrier layers is 0.01 to 0.15 μm.

25. A semiconductor laser comprsiing:
a semi-insulative semiconductive substrate;
a first semiconductor layer having a first energy band gap;
a second semiconductor layer having a second energy band gap;
a laser active layer sandwiched between the first and second semiconductor layers, the laser active layer having quantum well and barrier layers, the quantum well layers having an energy band gap smaller than the first energy band gap and smaller than the second energy band gap, said laser active layer and the first and second semiconductor layers forming a resonant cavity, said laser active layer having a laser active region and mixed crystal regions which sandwich the laser active region in a direction perpendicular to the length of the resonant cavity, the mixed crystal regions being formed by converting said laser active layer into mixed crystal by impurity induced intermixing of selective impurity doping, the mixed crystal regions sandwiching the laser active region respectively being of opposite conductivity type to each other;
first and second electrodes for injecting carriers to said laser active layer; and
means for electrically connecting the first and second electrodes to the respective mixed crystal regions, so as to transfer carriers between said first and second electrodes and the respective mixed crsytal regions, whereby carriers can be injected into the laser active region in a direction parallel to the laser active layer.

26. A semiconductor laser accoridng to claim 25, wherein the first and second semiconductor layers are undoped semiconductor layers.

27. A semiconductor device according to claim 25, wherein the mixed crystal regions are buried in the first and second semiconductor layers.

28. A semiconductor laser according to claim 27, wherein the first and seocnd semiconductor layers are undoped semiconductor layers.

* * * * *